US006322625B2

United States Patent
Im

(10) Patent No.: US 6,322,625 B2
(45) Date of Patent: *Nov. 27, 2001

(54) CRYSTALLIZATION PROCESSING OF SEMICONDUCTOR FILM REGIONS ON A SUBSTRATE, AND DEVICES MADE THEREWITH

(75) Inventor: James S. Im, New York, NY (US)

(73) Assignee: The Trustees of Columbia University in the City of New York, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,533

(22) Filed: Nov. 27, 1998

Related U.S. Application Data

(63) Continuation of application No. PCT/US96/07730, filed on Mar. 28, 1996.

(51) Int. Cl.⁷ ................................................. G30B 13/00
(52) U.S. Cl. .............................. 117/43; 117/44; 117/904; 438/779
(58) Field of Search ...................... 257/45, 75; 345/92; 349/42; 117/37, 43–46, 54, 56, 73, 74, 904, 923; 438/149, 166, 479, 481, 486–488, 490; 148/DIG. 90

(56) References Cited

U.S. PATENT DOCUMENTS

| Re. 33,836 | 3/1992 | Resor, III et al. ...................... 355/43 |
| 4,234,358 | * 11/1980 | Celler et al. ............................ 117/41 |
| 4,382,658 | 5/1983 | Shields et al. ......................... 349/122 |
| 4,727,047 | 2/1988 | Bozler et al. .......................... 438/464 |
| 4,855,014 | 8/1989 | Kakimoto et al. ..................... 117/45 |
| 4,870,031 | * 9/1989 | Suguhara et al. ..................... 438/479 |
| 4,940,505 | 7/1990 | Schachameyer et al. ............. 117/97 |

(List continued on next page.)

FOREIGN PATENT DOCUMENTS

| 2283036 | 11/1990 | (JP) . |
| 6252048 | 9/1994 | (JP) . |
| 6283422 | 10/1994 | (JP) . |
| 7176757 | 7/1995 | (JP) . |

OTHER PUBLICATIONS

H.J. Kim and James S. Im, "Grain Boundary Location–Controlled Poly–Si Films for TFT Devices Obtained Via Novel Excimer Laser Process," Abstracts for Symposium of Materials Research Society, Nov.27 to Dec. 2, 1994, p. 230.

S.D. Brotherton, "Polycrystalline Silicon Thin Film Transistors," 10 Semicond. Sci. Tech., pp. 721–738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491–98 (1994).

(List continued on next page.)

Primary Examiner—Robert Kunemund
Assistant Examiner—Kin-Chan Chen
(74) Attorney, Agent, or Firm—Baker Botts LLP

(57) ABSTRACT

Semiconductor integrated devices such as transistors are formed in a film of semiconductor material formed on a substrate. For improved device characteristics, the semiconductor material has regular, quasi-regular or single-crystal structure. Such a structure is made by a technique involving localized irradiation of the film with one or several pulses of a beam of laser radiation, locally to melt the film through its entire thickness. The molten material then solidifies laterally from a seed area of the film. The semiconductor devices can be included as pixel controllers and drivers in liquid-crystal display devices, and in image sensors, static random-access memories (SRAM), silicon-on-insulator (SOI) devices, and three-dimensional integrated circuit devices.

62 Claims, 9 Drawing Sheets

U.S. PATENT DOCUMENTS

| | | | |
|---|---|---|---|
| 5,061,655 | 10/1991 | Ipposhi et al. | 117/45 |
| 5,204,659 | 4/1993 | Sarma | 345/89 |
| 5,291,240 * | 3/1994 | Jain | 355/53 |
| 5,373,803 | 12/1994 | Noguchi et al. | 117/8 |
| 5,395,481 | 3/1995 | McCarthy | 438/479 |
| 5,409,867 | 4/1995 | Asano | 438/487 |
| 5,456,763 | 10/1995 | Kaschmitter et al. | 136/258 |
| 5,496,768 | 3/1996 | Kudo | 438/487 |
| 5,529,951 | 6/1996 | Noguchi et al. | 438/487 |
| 5,591,668 * | 1/1997 | Maegawa et al. | 438/779 |
| 5,766,989 * | 6/1998 | Maegawa et al. | 438/166 |
| 6,130,009 * | 10/2000 | Smith et al. | 430/1 |

OTHER PUBLICATIONS

E. Fogarassy et al., "Pulsed Laser Crystallization of Hydrogen–Free a–Si Thin Films for High–Mobility Poly–Si TFT Fabrication," 56 Applied Physics A—Solids and Surfaces, pp. 365–373 (1993).

Y. Miyata et al, "Low–Temperature Polycrystalline Silicon Thin–Film Transistors for Large–Area Liquid Crystal Display," 31 Japanese J. of Applied Physics Part 1—Regular Papers Short Notes & Review Papers, pp. 4559–62 (1992).

* cited by examiner

CRYSTALLIZATION PROCESSING OF SEMICONDUCTOR FILM REGIONS ON A SUBSTRATE, AND DEVICES MADE THEREWITH

This Application is a continuation of PCT/US96/07730 filed Mar. 28, 1996.

TECHNICAL FIELD

The invention relates to semiconductor materials processing for semiconductor integrated devices.

BACKGROUND OF THE INVENTION

Semiconductor devices can be made in a layer or film of silicon on a quartz or glass substrate, for example. This technology is in use in the manufacture of image sensors and active-matrix liquid-crystal display (AMLCD) devices. In the latter, in a regular array of thin-film transistors (TFT) on an appropriate transparent substrate, each transistor serves as a pixel controller. In commercially available AMLCD devices, the thin-film transistors are formed in hydrogenated amorphous silicon films (a-Si:H TFTs).

In the interest of enhanced switching characteristics of TFTs, polycrystalline silicon has been used instead of amorphous silicon. A polycrystalline structure can be obtained by excimer-laser crystallization (ELC) of a deposited amorphous or microcrystalline silicon film, for example.

However, with randomly crystallized poly-silicon, the results remain unsatisfactory. For small-grained polysilicon, device performance is hampered by the large number of high-angle grain boundaries, e.g., in the active-channel region of a TFT. Large-grained poly-silicon is superior in this respect, but significant grain-structure irregularities in one TFT as compared with another then result in non-uniformity of device characteristics in a TFT array.

SUMMARY OF THE INVENTION

For improved device characteristics and device uniformity, a lateral solidification technique is applied to a semiconductor film on a substrate. The technique, which may be termed artificially controlled super-lateral growth (ACSLG), involves irradiating a portion of the film with a suitable radiation pulse, e.g. a laser beam pulse, locally to melt the film completely through its entire thickness. When the molten semiconductor material solidifies, a crystalline structure grows from a preselected portion of the film which did not undergo complete melting.

In a preferred first embodiment of the technique, an irradiated structure includes a substrate-supported first semiconductor film, a heat-resistant film on the first semiconductor film, and a second semiconductor film on the heat-resistant film. In this embodiment, both front and back sides of the structure are irradiated with a pulse.

In a preferred second embodiment, lateral solidification is from a first region via a constricted second region to a third region which is intended as a device region. One-sided irradiation is used in this embodiment, in combination with area heating through the substrate.

In a preferred third embodiment, a beam is pulsed repeatedly in forming an extended single-crystal region as a result of laterally stepping a radiation pattern for repeated melting and solidification.

Advantageously, the technique can be used in the manufacture of high-speed liquid crystal display devices, wherein pixel controllers or/and driver circuitry are made in single-crystal or regular/quasi-regular polycrystalline films. Other applications include image sensors, static random-access memories (SRAM), silicon-on-insulator (SOI) devices, and three-dimensional integrated circuit devices.

DETAILED DESCRIPTION OF PREFERRED EMBODIMENTS

Described in the following are specific, experimentally realized examples, as well as certain variations thereof. Explicitly or implicitly, some variations are common to more than one of the embodiments, and further variations, within the scope of the claims, will be apparent to those skilled in the art. Included, e.g., is the use of semiconductor materials other than silicon, such as germanium, silicon-germanium, gallium arsenide or indium phosphide, for example. Included also is the use of a substrate of any suitable material, e.g., silicon dioxide, quartz, glass or plastic, subject to considerations of stability, inertness and heat resistance under processing conditions. And included is the use of a radiation beam other than a laser beam, e.g., an electron or ion beam.

First Embodiment

Figure 1:
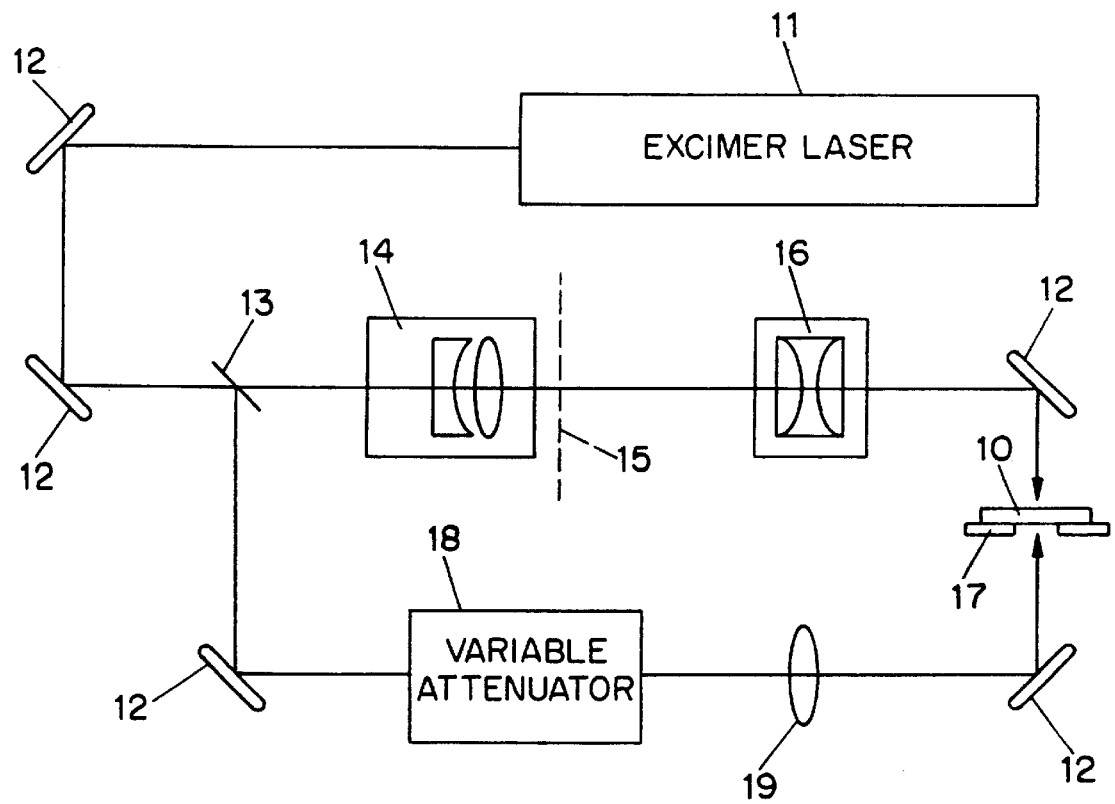
FIG. 1 is a schematic representation of a projection irradiation system as can be used for the first embodiment of the technique.

The projection irradiation system of FIG. 1 includes an excimer laser 11, mirrors 12, a beam splitter 13, a variable-focus field lens 14, a patterned projection mask 15, a two-element imaging lens 16, a sample stage 17, a variable attenuator 18 and a focusing lens 19. With this system, simultaneous radiation pulses can be applied to the front and back sides of a sample 10 on the stage 17.

Figure 2:
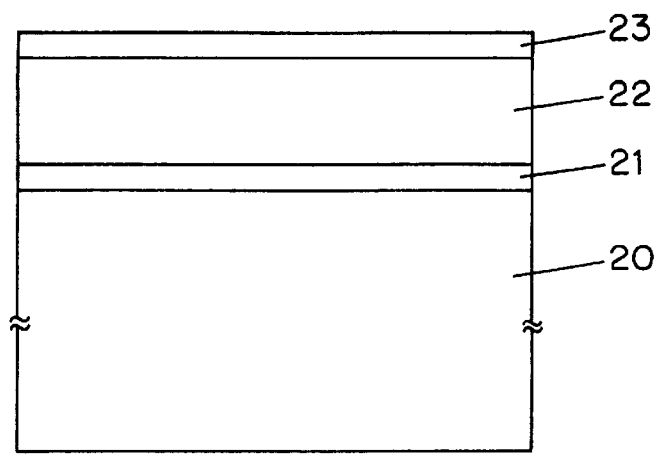
FIG. 2 is a schematic, greatly enlarged side view of a sample structure for the first embodiment.

For the first embodiment of the technique, a "dual-layer" (DL) sample structure was prepared as shown in FIG. 2, including a transparent substrate 20, a first amorphous silicon film 21, an $SiO_2$ film 22, and a second amorphous silicon film 23. Film thicknesses were 100 nanometers for the amorphous silicon films and 500 nanometers for the $SiO_2$ film. Alternative heat-resistant materials such as, e.g., silicon nitride or a high-temperature glass may be used for the film 22.

With pattern projection onto the second or top silicon film 23 and broad-beam irradiation of the first or bottom silicon film 21, the first silicon film 21 can be regarded as a sacrificial layer which is included favorably to affect the thermal environment for maximized lateral crystal growth in the top silicon film 23. The roles of these films is reversed if, alternatively, the pattern is projected through the substrate onto the first film. In the pattern-irradiated film, large, laterally solidified grains will be formed, making the processed film well-suited for TFTs, for example.

Structures in accordance with FIG. 2 were prepared by sequential low-pressure chemical vapor deposition (LPCVD) of a-Si, $SiO_2$, and again a-Si on a quartz substrate. Other suitable deposition methods, for producing amorphous or microcrystalline deposits, include plasma-enhanced chemical vapor deposition (PECVD), evaporation or sputtering, for example.

Samples were placed onto the stage 17 of the projection irradiation system of FIG. 1. The mask 15 had a pattern of simple stripes 50 micrometers wide, with various separation distances from 10 to 100 micrometers.

The mask pattern was projected onto the samples with different reduction factors in the range from 3 to 6. The back-side energy density was controlled by the variable attenuator 18. Samples were irradiated at room temperature with a 30-nanosecond XeCl excimer laser pulse having a wavelength of 308 nanometers, quartz being transparent at this wavelength. Such a laser is commercially available under the designation LambdaPhysik Compex 301. For a glass substrate, a longer wavelength would have been required, e.g., 348 nanometers.

Irradiation was with fixed front-side energy density and with various back-side energy densities. Estimated front-side energy density was approximately 1.0 J/cm$^2$ at the sample plane. The back-side energy densities were in the range from 170 to 680 mJ/cm$^2$.

For examination subsequent to irradiation, the films were thoroughly defect-etched using Secco etchant and examined using scanning electron microscopy (SEM). The largest, most uniform grains were obtained at a back-side energy density of 510 mJ/cm$^2$. These grains grew laterally from the two sides of stripe regions, forming two rows of grains with a well-defined grain boundary at the center line of the stripe.

Figure 3A:
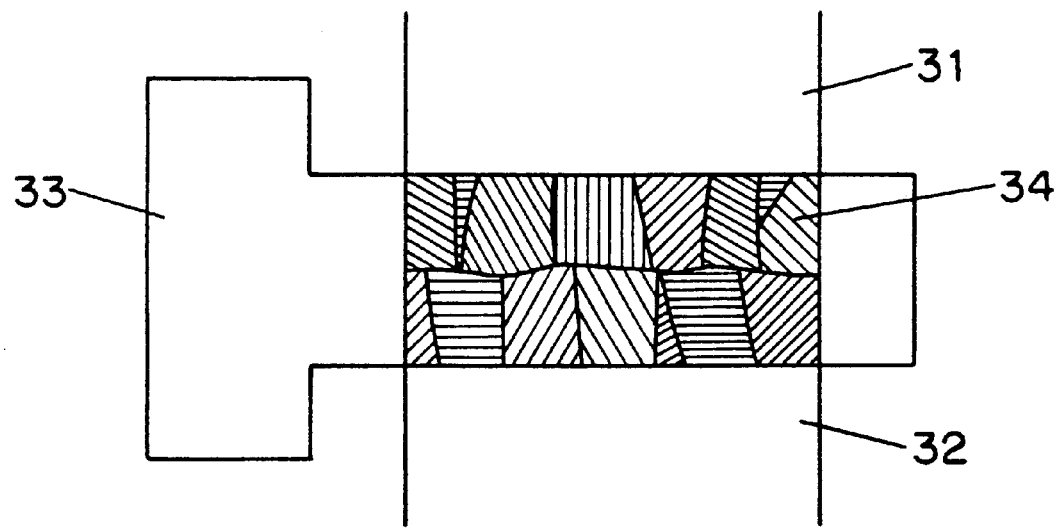
FIGS. 3A and 3B are schematic, greatly enlarged top views of TFT device microstructures which can be made in semiconductor material of the first embodiment.
Figure 3B:
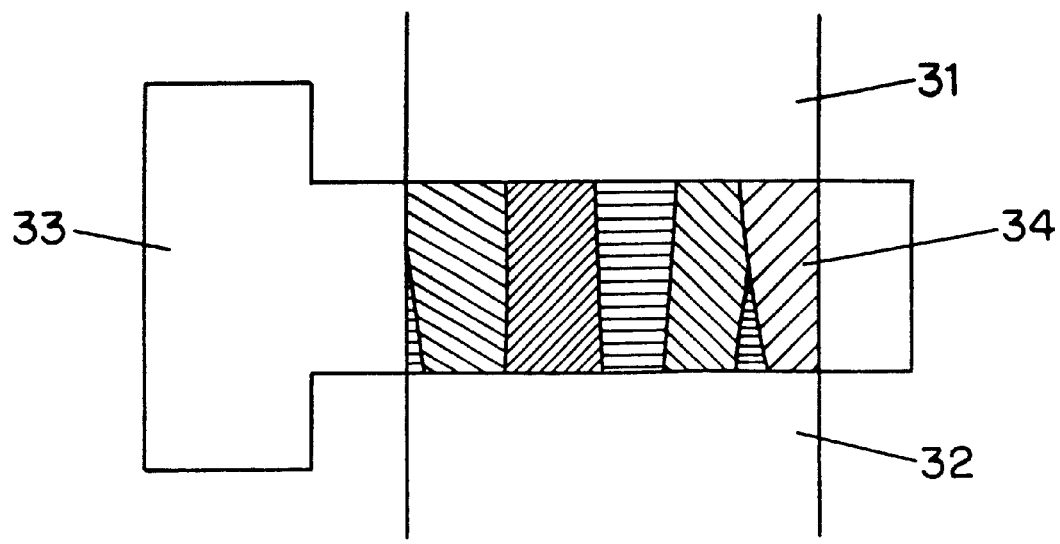

Even if the resulting individual crystals may not be large enough to accommodate the entire active-channel region of a TFT, they form a regular or quasi-regular polycrystalline structure which can serve as active-channel region of a TFT, e.g., as illustrated in FIG. 3A or FIG. 3B. Shown are a source electrode 31, a drain electrode 32, a gate electrode 33 and an active-channel region 34. In FIG. 3A, the active-channel region includes both rows of grains produced as described above. With grains sufficiently large as in FIG. 3B, the active-channel region can be formed by a single row of grains.

In processing according to the first embodiment, the role of the sacrificial bottom film 21 may be understood as being that of a heat susceptor which stores energy when heated by the beam, the greatest benefit being obtained when this film melts. The stored heat is released during solidification. This decreases the degree to which the top film 23 loses heat by conduction. Accordingly, for maximum benefit, care is called for in proper dimensioning of the irradiated structure. If the $SiO_2$ film 22 is too thin, the thermal evolution of the silicon films 21 and 23 will tend to track together, without significant benefit from the inclusion of the film 21. On the other hand, if the film 22 is too thick with respect to the thermal diffusion length of the physical process, the film 21 will have insufficient influence on the transformation in the top film 23. As to the bottom film 21, its thickness should be chosen for this film to have sufficient thermal mass. But the thicker the film 21, the more energy will be required for its melting.

As alternatives to projection of a pattern onto the silicon layer 23, a desired pattern may be defined there by a proximity mask, a contact mask, or a deposited mask layer which is patterned photo-lithographically, for example.

In one variant of masking, a mask layer may serve to reduce heating in the area beneath the mask, e.g., by absorbing or reflecting incident radiation. Alternatively, with a suitable mask material of suitable thickness, a complementary, anti-reflection effect can be realized to couple additional energy into the semiconductor film beneath the mask material. For example, an $SiO_2$ film can be used to this effect on a silicon film. This variant is advantageous further in that the mask layer can serve as a restraint on the molten semiconductor material, thus preventing the molten semiconductor layer from agglomerating or deforming under surface tension.

Second Embodiment

Figure 4:
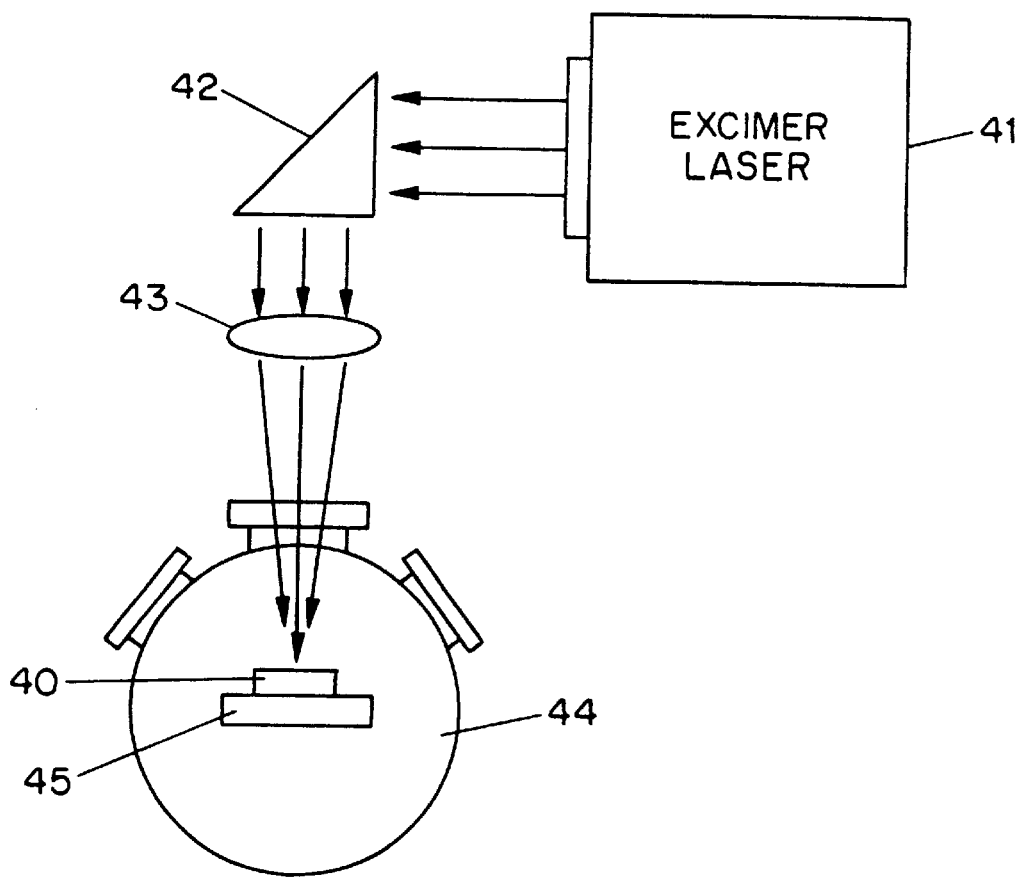
FIG. 4 is a schematic representation of an irradiation system as can be used for the second embodiment of the technique.

The irradiation system of FIG. 4 includes an excimer laser 41, a prism deflector 42, a focusing lens 43, a vacuum chamber 44 and a hot stage 45 on which a sample 40 is disposed.

Figure 5:
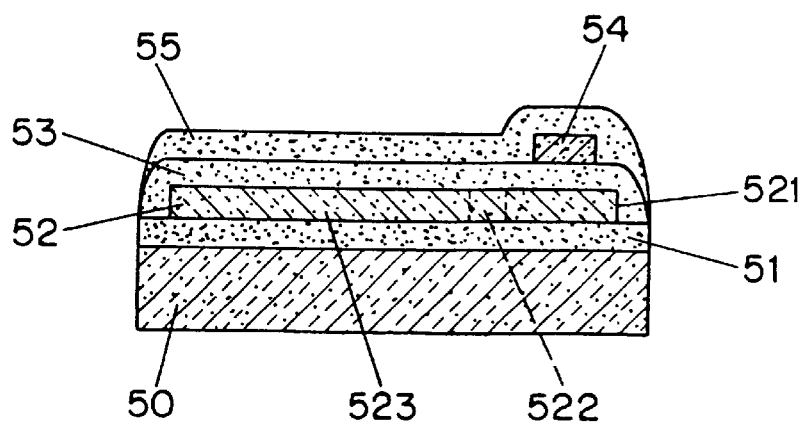
FIG. 5 is a schematic, greatly enlarged side view of a sample structure for the second embodiment.

For the second embodiment of the technique and using the irradiation system of FIG. 4, the sample structure of FIG. 5 includes a substrate 50, a thermal oxide film 51, a first patterned amorphous silicon film 52, an $SiO_2$ film 53, a second patterned silicon film 54, and a further deposited $SiO_2$ film 55. Typical thicknesses are 100 nanometers for the thermal oxide film 51, 100 nanometers for the a-Si film 52, 210 nanometers for the $SiO_2$ film 53, 120 nanometers for the a-Si film 54, and 170 nanometers for the $SiO_2$ film 55.

Figure 6A:
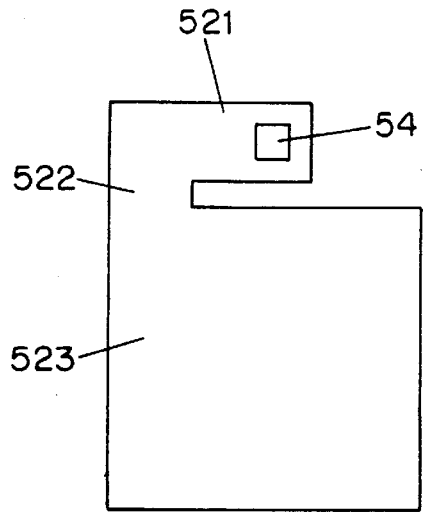
FIGS. 6A–6D are schematic top views of the sample structure of FIG. 5 at sequential stages of processing.

Such a sample structure was prepared by depositing the amorphous silicon film 52 by low-pressure chemical vapor deposition (LPCVD) onto the thermal oxide film 51 on a silicon wafer 50. The silicon film 52 was coated with a photoresist which was then exposed in a stepper and developed, and the silicon film 52 was reactively ion-etched in $SF_6/O_2$ plasma for patterning. The resulting pattern of a "first-level island" of the silicon film 52 is shown in FIG. 6A as viewed from the top. The pattern consists of three parts: a square "main-island" region 523 which is intended for eventual device use, a rectangular "tail" region 521, and a narrow "bottleneck" region 522 connecting the tail region 521 with the main-island region 523. Dimensions were chosen as follows: 20 by 10 micrometers for the tail region 521, 5 by 3 micrometers for the bottleneck region 522, and different dimensions in the range from 10 by 10 to 50 by 50 micrometers for the main-island region 521.

The first-level islands were encapsulated with the $SiO_2$ film 53 by plasma-enhanced chemical-vapor deposition (PECVD), and amorphous silicon was deposited on top. Photolithographic processing was used again, for patterning the amorphous silicon film as a "second-level island" 54 dimensioned 5 by 5 micrometers. The second-level island 54 is positioned directly above the tail region 521 to serve as a beam blocker during irradiation. Last, the entire structure was encapsulated with PECVD $SiO_2$.

For processing, a sample was placed on a resistively heated graphite hot stage inside a vacuum chamber at a pressure of $10^{-5}$ torr. Vacuum-processing can be dispensed with if a suitable alternative heater is available. Heating was to a substrate temperature of 1000 to 1200° C., which required a ramp-up time interval of about three minutes. Before irradiation, the sample was held at the final substrate temperature for approximately two minutes. The sample temperature was monitored occasionally by a directly attached thermocouple and continuously by a digital infrared thermometer. The sample was irradiated with a single excimer-laser pulse at energy densities that were sufficiently high to completely melt all of the first-level island except for the beam-blocked area within the tail region.

For analysis of the microstructure, the irradiated samples were Secco-etched. For samples irradiated at a substrate temperature of 1150° C., optical Nomarski micrographs of the Secco-etched samples showed complete conversion of islands 20 by 20, 40 by 40 and 50 by 50 micrometers into single-crystal islands (SCI). Defect patterns in the etched samples suggest that the main-island zones contain low-angle sub-boundaries similar to those observed in zone melting recrystallization (ZMR), as well as planar defects which have been identified in SLG studies. At a lower substrate temperature, such as at 1100° C., only the smaller, 20-by-20 micrometer islands were converted into single-crystal islands free of high-angle grain boundaries. And at still-lower substrate temperatures of 1050° C. and 1000° C., high-angle grain boundaries appeared even in the 20 by 20 micrometer islands.

Figure 6B:
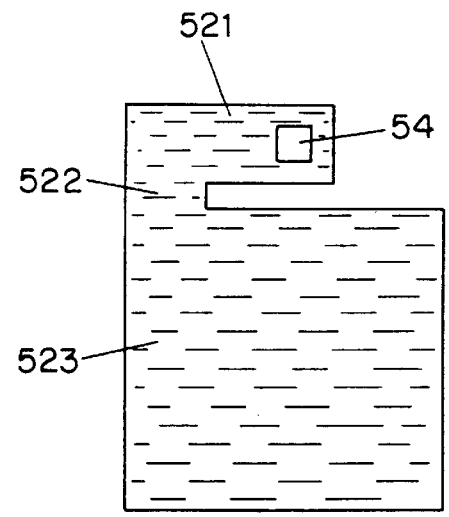
Figure 6C:
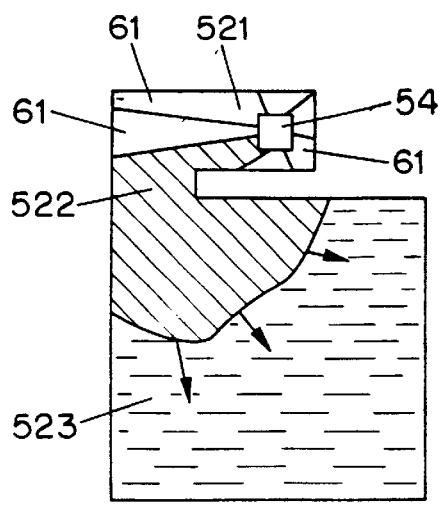
Figure 6D:
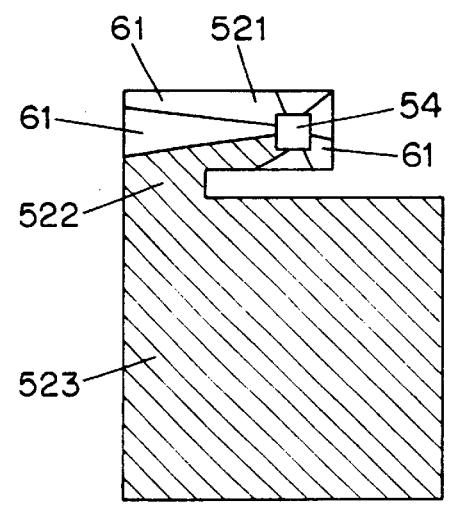

The solidification sequence in this second embodiment may be understood with reference to FIGS. 6B–6D as follows: Upon irradiation, the second-level square 54 blocks most of the beam energy incident on the area, which prevents complete melting in the beam-blocked area of the tail region 521. The rest of the exposed first level regions melts completely as illustrated by FIG. 6B. As the film is conductively cooled through the substrate, the liquid-solid interface at the beam-blocked region undercools, and silicon grains 61 start to grow radially outward from the beam-blocked region. Within the tail region 521, many of the grains 61 are quickly occluded, and only one or a few favorably located grains grow toward the bottleneck 522. The bottleneck 522 is configured such that just one of these grains expands through the bottleneck 522 into the main-island region 523. If the substrate temperature is high enough and the main island 523 is small enough to prevent nucleation in the super-cooled liquid, lateral growth of the one grain that grew through the bottleneck 522 converts the entire main island 523 into a single-crystal region.

Thus, successful conversion of the main-island region 523 into single-crystal form requires a suitable combination of substrate temperature and island size. The molten silicon must be sustained at a temperature which is sufficiently high for the characteristic time of nucleation for a specific volume to be much longer than the characteristic time required for the complete conversion by lateral solidification. Since the characteristic conversion time depends mainly on the distance to be converted, i.e., the lateral dimension of the main island, the island size must be related to the substrate temperature such that the characteristic conversion time is commensurate with the average lateral growth distance that can be achieved before any nucleation is triggered within the liquid. As compared with zone-melting recrystallization, the present technique allows the recrystallization of very thin films, e.g., having a thickness of 100 nanometers or less.

Instead of by beam blocking, a seed region can be defined by complementary masking with an anti-reflection film, as described above for the first embodiment. Alternatively further, a seed region can be defined by projection.

Third Embodiment

Figure 7:
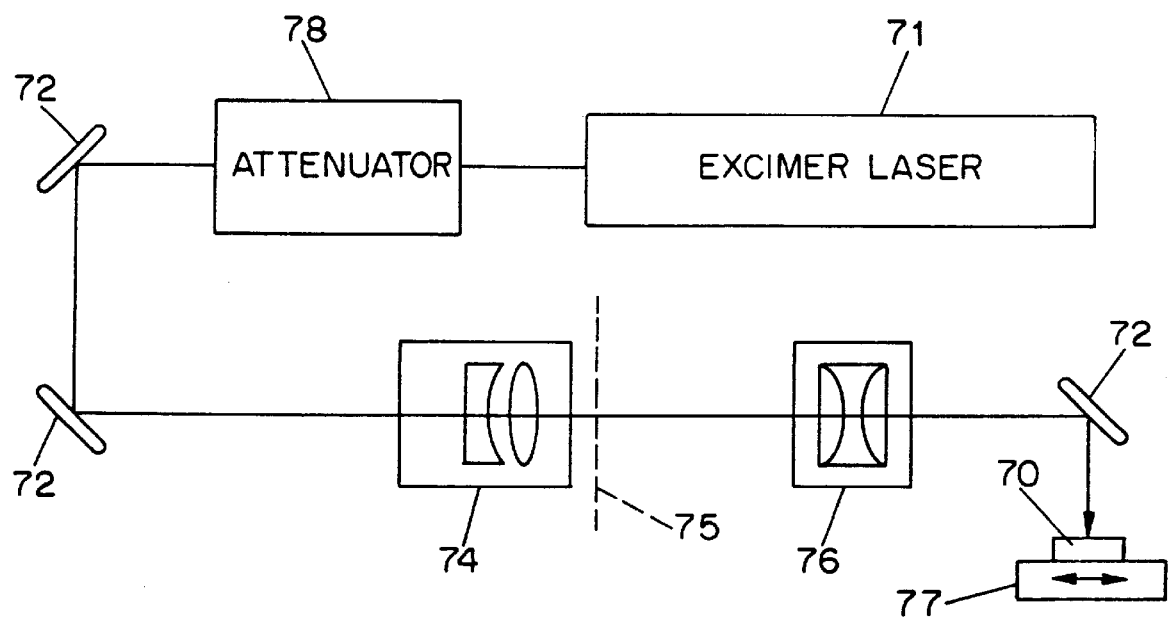
FIG. 7 is a schematic representation of an irradiation system as can be used for the third embodiment.

The projection irradiation system of FIG. 7 includes an excimer laser 71, mirrors 72, a variable-focus field lens 74, a patterned mask 75, a two-element imaging lens 76, a sample stage 77, and a variable attenuator 78. A sample 70 is disposed on the sample stage 77. This system can be used to produce a shaped beam for stepped growth of a single-crystal silicon region in a sequential lateral solidification (SLS) process. Alternatively, a proximity mask or even a contact mask may be used for beam shaping.

Figure 8:
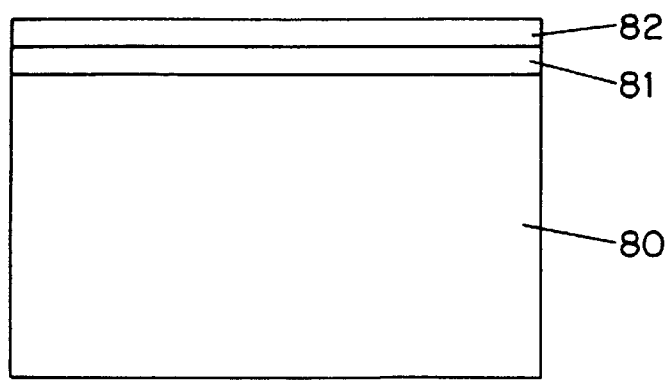
FIG. 8 is a schematic, greatly enlarged side view of a sample structure for the third embodiment.

The sample structure of FIG. 8 has a substrate 80, a thermal oxide film 81, and an amorphous silicon film 82.

Figure 9A:
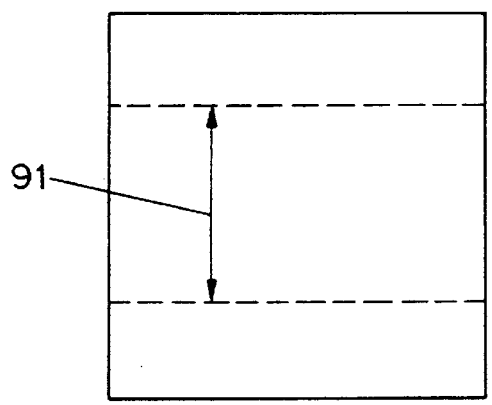
FIGS. 9A–9F are schematic top views of a sample structure with side view as in FIG. 8 at sequential stages in a first version of a first variant of processing.
Figure 9D:
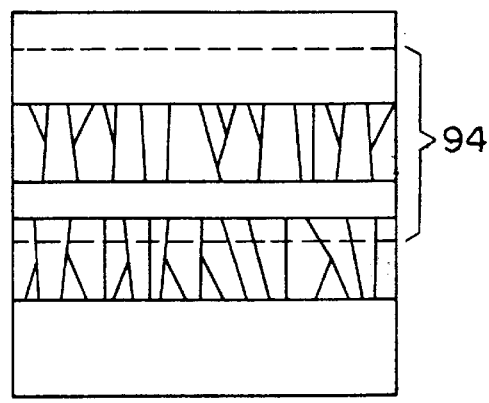
Figure 9B:
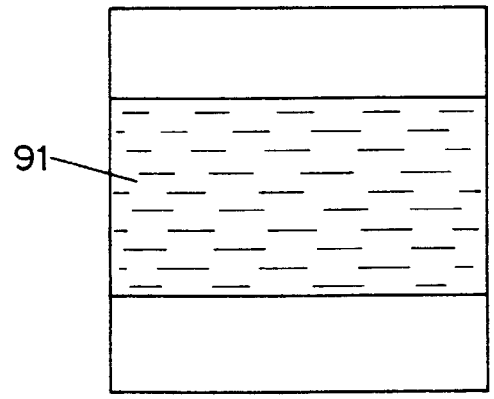
Figure 9E:
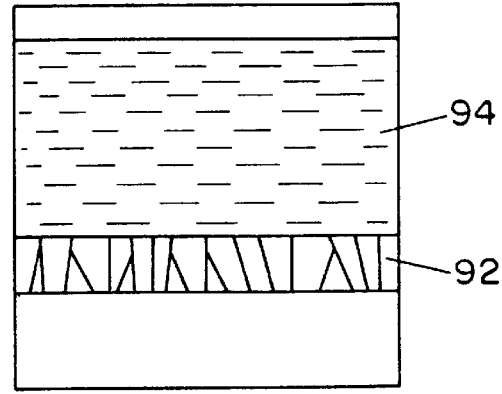
Figure 9C:
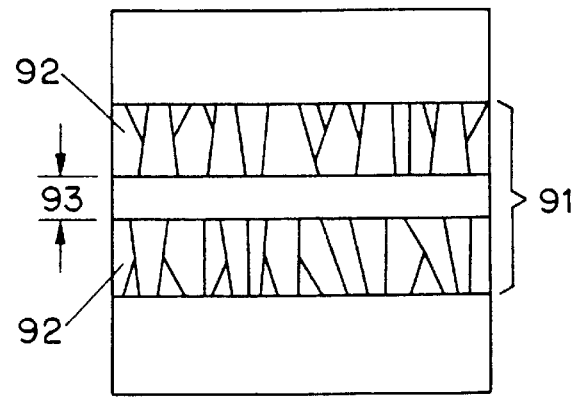
Figure 9F:
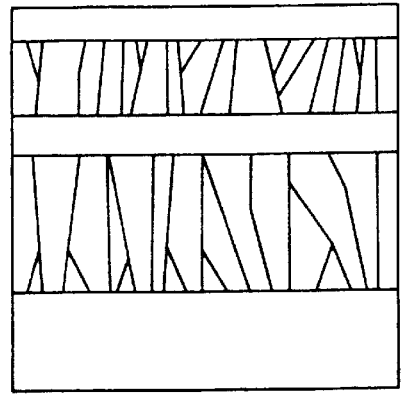
Figure 10A:
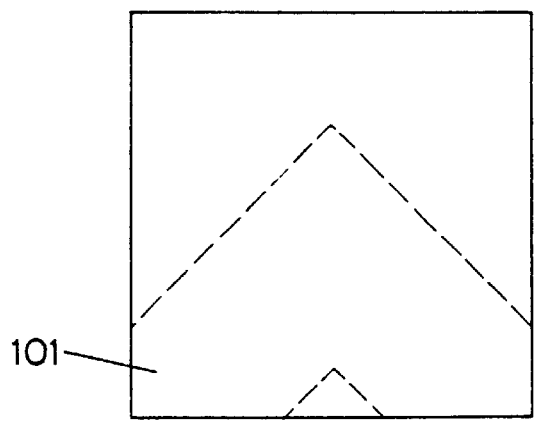
FIGS. 10A–10F are schematic top views of a sample structure with side view as in FIG. 8 at sequential stages in a second version of the first variant of processing.
Figure 10D:
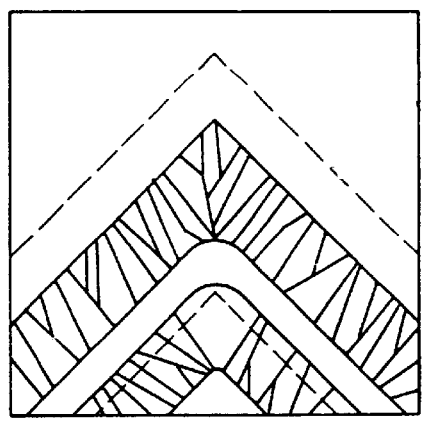
Figure 10B:
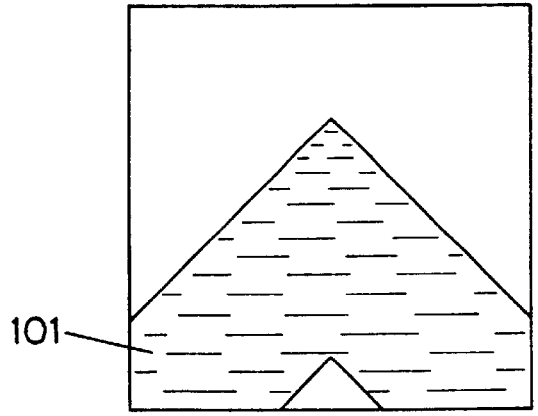
Figure 10E:
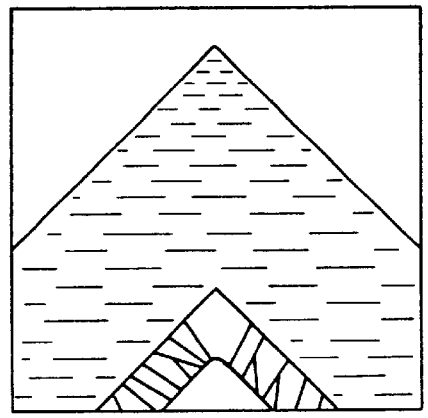
Figure 10C:
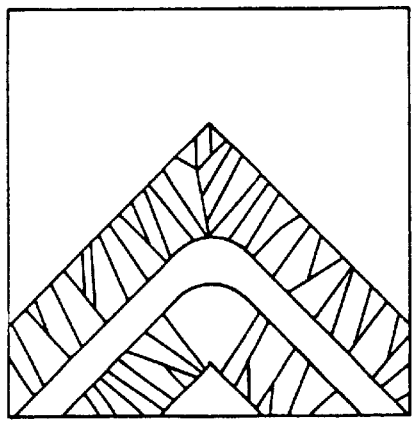
Figure 10F:
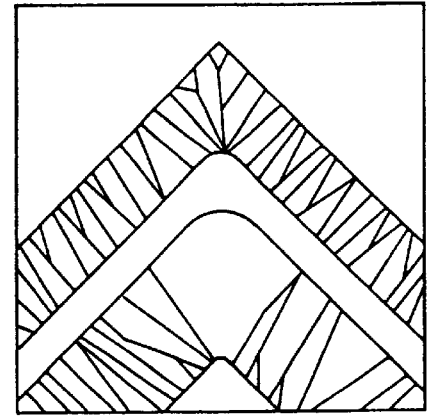
Figure 11A:
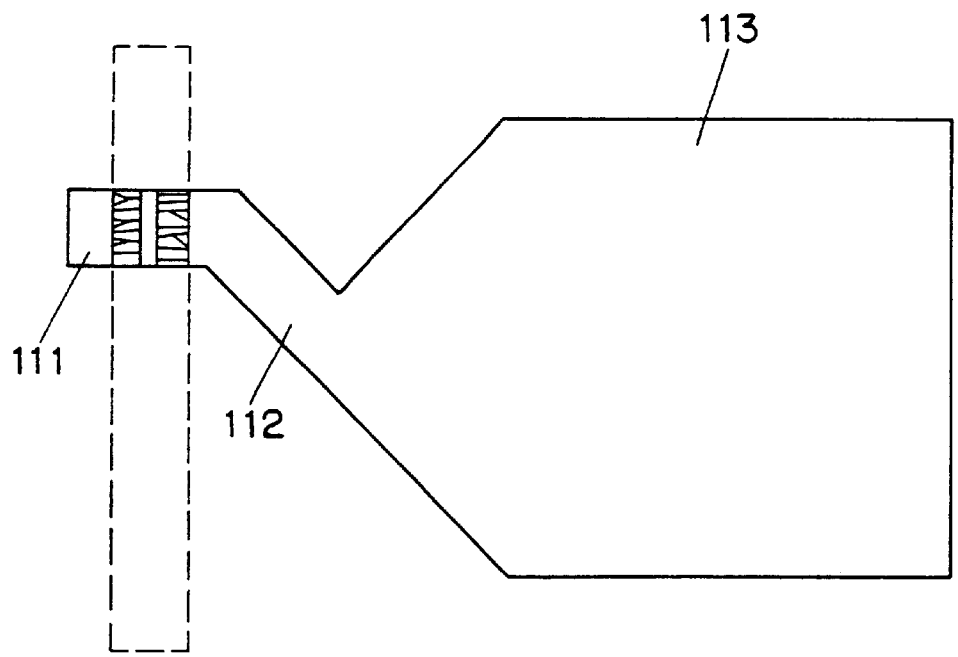
FIGS. 11A–11C are schematic top views of a sample structure at sequential stages of a second variant of processing.
Figure 11B:
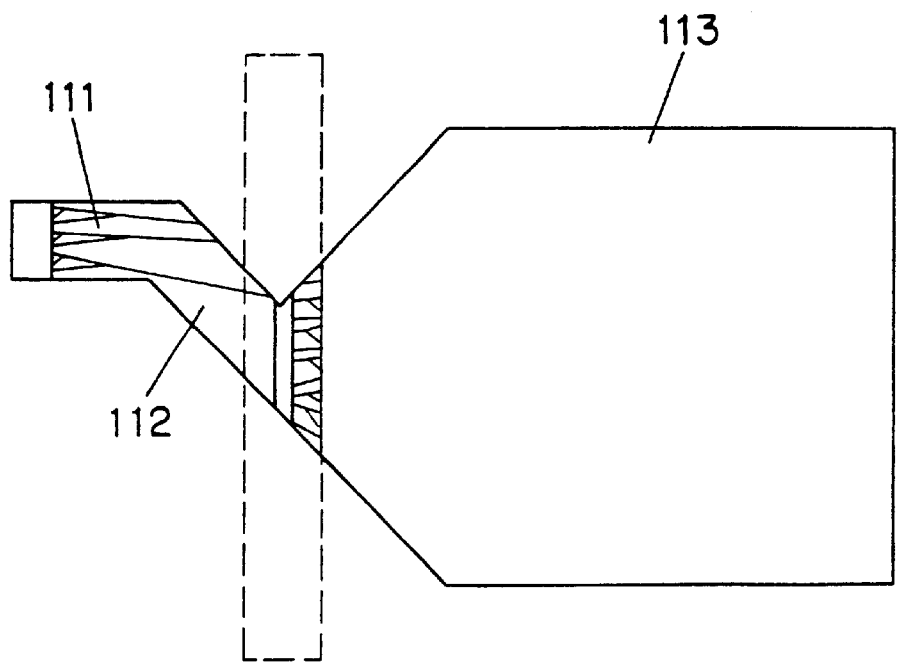

In the following, the third embodiment of the technique is described with reference to FIGS. 9A–9F and 10A–10F showing two versions of a first variant, and FIGS. 11A–11B showing a second variant.

Starting with the amorphous silicon film 82, which in this exemplary embodiment is patterned as a rectangle (FIG. 9A), a region 91, bounded by two broken lines, of the silicon film 82 is irradiated with a pulse, to completely melt the silicon in that region (FIG. 9B), and then resolidify the molten silicon (FIG. 9C) in the region 91. Here, the region 91 is in the shape of a stripe, and irradiation of the region 91 may be by masked projection or by use of a proximity mask. Upon resolidification of the molten silicon in the region 91, two rows of grains grow explosively from the broken line boundaries of the region 91 towards the center of the region 91. Growth of the two rows of grains is over the characteristic lateral growth to a final distance 92. In any remainder of region 91, a fine grained polycrystalline region 93 is formed. Preferably, the width of the stripe is chosen such that, upon resolidification, the two rows of grains approach each other without converging. Greater width, which is not precluded, does not contribute to the efficacy of processing. Lesser width tends to be undesirable since the subsequent step may have to be reduced in length, and the semiconductor surface may become irregular where grains growing from opposite directions come together during the solidification process. An oxide cap may be formed over the silicon film to retard agglomeration and constrain the surface of the silicon film to be smooth.

A next region to be irradiated is defined by shifting (stepping) the sample with respect to the masked projection or proximity mask in the direction of crystal growth. The shifted (stepped) region 94 is bounded by two broken lines in FIG. 9D. The distance of the shift is such that the next region to be irradiated 92 overlaps the previously irradiated region 91 so as to completely melt one row of crystals while partially melting the other row of crystals, as shown in FIG. 9E. Upon resolidification, the partially melted row of crystals will become longer, as shown in FIG. 9F. In this fashion, by repeatedly shifting the irradiated portion, single crystalline grains of any desired length may be grown.

If the pattern of the irradiated region is not a simple stripe, but is in the shape of a chevron 101, as defined by the broken lines in FIG. 10A, the same sequence of shifting the irradiated region shown in FIGS. 10B–10F will result in the enlargement of one grain growing from the apex of the trailing edge of the shifting (stepping) chevron pattern. In this manner, a single-crystal region can be grown with increasing width and length.

Figure 11C:
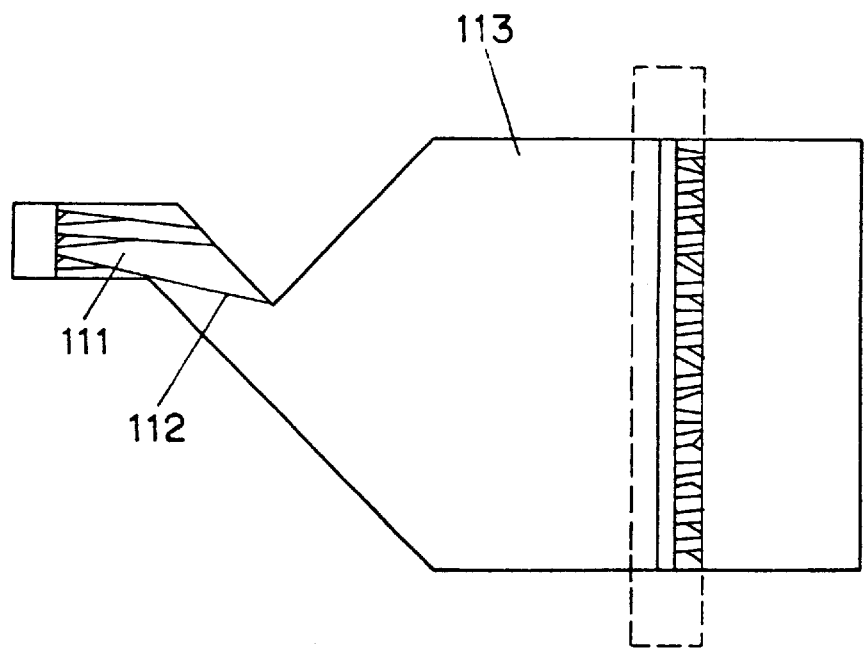

A large area single-crystal region can also be grown by applying sequentially shifted (stepped) irradiation regions to a patterned amorphous silicon film, such as that illustrated in FIG. 11A, having a tail region 111, a narrow bottleneck region 112 and a main island region 113. The cross-section of regions 111, 112 and 113 in FIGS. 11A–11C is similar to that shown in FIG. 5, except that the radiation blocking amorphous silicon region 54 and the second silicon dioxide layer 55 are absent. The region of irradiation defined by masked projection or a proximity mask is illustrated by the regions bounded by broken lines in FIGS. 11A–11C, which also show the sequential lateral shifting (stepping) of the irradiated region to obtain the growth of a single grain from the tail region 111 through the bottleneck region 112 to produce a single crystal island region 113.

Sequential lateral melting and resolidification in the examples of FIGS. 9A–9F, 10A–10F and 11A–11C were carried out on amorphous silicon films which had been deposited by chemical vapor deposition (CVD) on a silicon dioxide coated quartz substrate, with film thicknesses from 100 to 240 nanometers. The production of single-crystal stripes was confirmed in optical and scanning electron microscopic examination of defect-etched samples.

Optionally, the substrate may be heated, e.g., to reduce the beam energy required for melting or to lengthen the lateral growth distance per step. Such benefits may be realized also by two-sided irradiation of a sample on a stage as shown in FIG. 1.

FURTHER PROCESSING AND APPLICATIONS

With a semiconductor film processed by the present technique, integrated semiconductor devices can be manufactured by well-established further techniques such as pattern definition, etching, dopant implantation, deposition of insulating layers, contact formation, and interconnection with patterned metal layers, for example. In preferred thin-film semiconductor transistors, at least the active-channel region has a single-crystal, regular or at least quasi-regular microstructure, e.g., as illustrated by FIGS. 3A and 3B.

Figure 12:
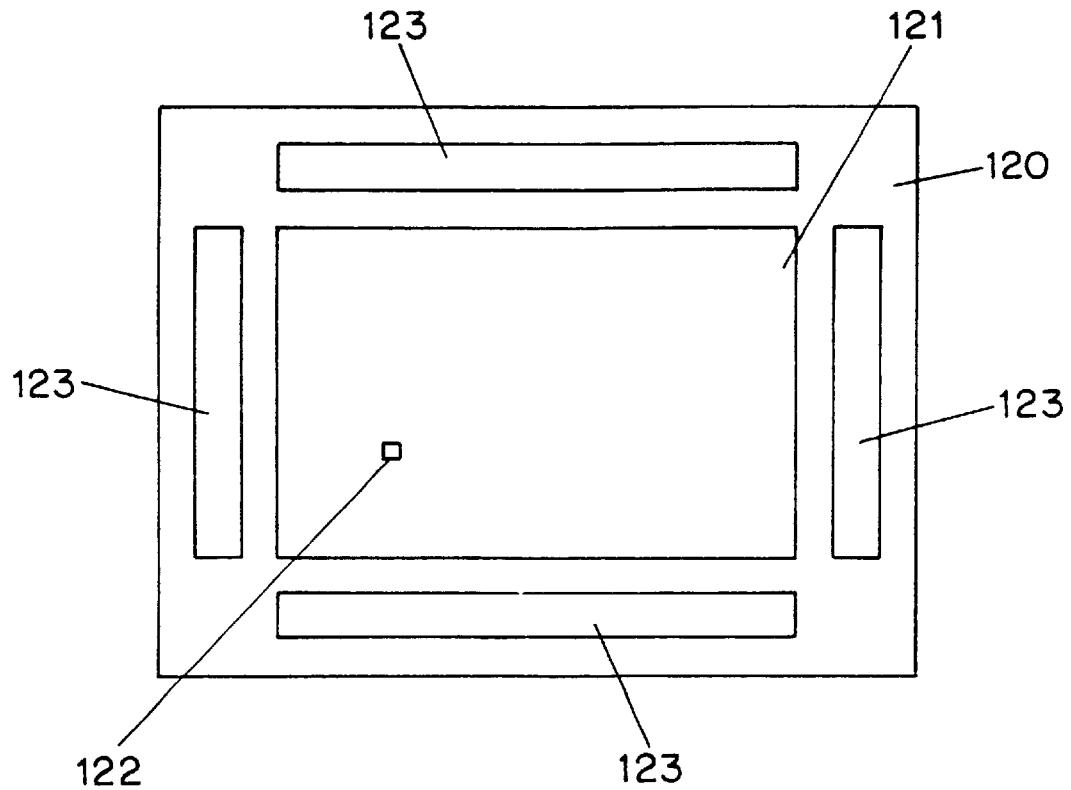
FIG. 12 is a schematic top view of a liquid-crystal display device in which TFTs are included.

Of particular interest is the inclusion of such TFTs in liquid-crystal display devices as schematically shown in FIG. 12. Such a device includes a substrate 120 of which at least a display window portion 121 is transparent. The display window portion 121 includes a regular array of pixels 122, each including a TFT pixel controller. Each pixel controller can be individually addressed by drivers 123. Preferably, pixel controllers or/and driver circuitry are implemented in semiconductor material processed in accordance with the technique of the present invention.

Other applications include image sensors, static random-access memories (SRAM), silicon-on-insulator (SOI) devices, and three-dimensional integrated circuit devices.

What is claimed is:

1. A method for making a polycrystalline region as a laterally extending portion of a supported film of semiconductor material, comprising:

simultaneously irradiating, with pulsed radiation which induces heat in the semiconductor material, front and back sides of a structure comprising a radiation-permeable substrate in back, a first semiconductor film on the substrate, a heat-resistant film on the first semiconductor film, and a second semiconductor film on the heat-resistant film, so as to melt all semiconductor material in a laterally extending region of the one of the semiconductor films which includes the portion, so that, after the simultaneous irradiation, a polycrystalline microstructure is formed in the region by lateral solidification from a boundary of the region.

2. The method of claim 1, wherein the region is delimited by parallel edges.

3. The method of claim 2, wherein the parallel edges are spaced apart by a distance for which simultaneous lateral solidification from the edges results in complete crystallization of the region.

4. The method of claim 1, wherein the semiconductor material comprises silicon.

5. The method of claim 1, wherein the heat-resistant layer consists essentially of $SiO_2$.

6. The method of claim 1, wherein the substrate is a glass substrate.

7. The method of claim 1, wherein the substrate is a quartz substrate.

8. The method of claim 1, wherein the laterally extending portion is in the first semiconductor film.

9. The method of claim 1, wherein the laterally extending portion is in the second semiconductor film.

10. The method of claim 1, wherein the region has a shape defined by a mask pattern.

11. The method of claim 10, wherein the mask pattern is projected.

12. The method of claim 10, wherein the mask pattern is defined by a proximity mask.

13. The method of claim 10, wherein the mask pattern is defined by a contact mask.

14. The method of claim 1, wherein the radiation comprises laser radiation.

15. The method of claim 1, wherein the laterally extending region is encapsulated.

16. On a supporting substrate, a semiconductor film processed by the method of claim 1.

17. On a supporting substrate, a plurality of semiconductor devices in a semiconductor film processed by the method of claim 1.

18. On a supporting substrate, an integrated circuit comprising a plurality of thin-film transistors in which at least the active-channel region is processed by the method of claim 1.

19. A liquid-crystal display device comprising a plurality of pixel-controller thin-film transistors in which at least the active-channel region is processed by the method of claim 1.

20. A liquid-crystal display device comprising a pixel-driver integrated circuit which comprises a plurality of thin-film transistors in which at least the active-channel region is processed by the method of claim 1.

21. A method for making a laterally extending crystalline region in a film of semiconductor material on a substrate, comprising:

irradiating, with pulsed radiation which induces heat in the semiconductor material, a portion of the semiconductor film so as to entirely melt the semiconductor material in the portion, and permitting the molten semiconductor material in the portion to solidify; wherein:

the portion is configured so as to include a first sub-portion, a second sub-portion which is contiguous to the first sub-portion, and a third sub-portion which is contiguous to the second sub-portion, the first sub-portion being configured for nucleation of semiconductor crystals at its boundary, the second sub-portion being configured such that just one of the nucleated crystals grows from the first sub-portion through the second sub-portion into the third sub-portion, and the third sub-portion being configured such that the one crystal occupies the third sub-portion in its entirety.

22. The method of claim 21, wherein the first sub-portion is configured with an island portion for nucleation of semiconductor crystals.

23. The method of claim 22, wherein the island portion has a shape defined by a mask pattern.

24. The method of claim 23, wherein the mask pattern is projected.

25. The method of claim 23, wherein the mask pattern is defined by a proximity mask.

26. The method of claim 23, wherein the mask pattern is defined by a contact mask.

27. The method of claim 21, wherein the configuration of the second sub-portion precludes a straight-line path between the first sub-portion and the third sub-portion.

28. The method of claim 21, wherein the semiconductor material comprises silicon.

29. The method of claim 21, wherein the substrate is heated.

30. The method of claim 21, wherein the substrate is a glass substrate.

31. The method of claim 21, wherein the substrate is a quartz substrate.

32. The method of claim 21, wherein the pulsed radiation is applied to front and back of the semiconductor film.

33. The method of claim 21, wherein the semiconductor film has a thickness not exceeding 100 nanometers.

34. The method of claim 21, wherein the radiation comprises laser radiation.

35. The method of claim 21, wherein the portion is encapsulated.

36. On a supporting substrate, a semiconductor film processed by the method of claim 21.

37. On a supporting substrate, a plurality of semiconductor devices in a semiconductor film processed by the method of claim 21.

38. On a supporting substrate, an integrated circuit comprising a plurality of thin-film transistors in which at least the active-channel region is processed by the method of claim 21.

39. A liquid-crystal display device comprising a plurality of pixel-controller thin-film transistors in which at least the active-channel region is processed by the method of claim 21.

40. A liquid-crystal display device comprising a pixel-driver integrated circuit which comprises a plurality of thin-film transistors in which at least the active-channel region is processed by the method of claim 21.

41. A method for making a laterally extending crystalline region in a film of semiconductor material on a substrate having at least a surface region consisting of a material which is different from the semiconductor material of the film and which is inert with respect to crystal growth in the film of semiconductor material, comprising:

(a) providing a film of semiconductor material to be crystallized directly on the at least a surface region of the substrate;

(b) irradiating, with pulsed radiation which induces heat in the semiconductor material, a first portion of the film so as to melt the semiconductor material in the first portion throughout its thickness;

(c) permitting the semiconductor material in the first portion to laterally solidify, thereby forming at least one semiconductor crystal at a boundary of the first portion, the first portion then being a previous portion for further processing;

(d) irradiating a further portion of the semiconductor material, which is stepped from the previous portion in a stepping direction and which overlaps the at least one semiconductor crystal in part, so as to melt the semiconductor material in the further portion throughout its thickness;

(e) permitting the molten semiconductor material in the further portion to laterally solidify, thereby enlarging the at least one semiconductor crystal by growth in the stepping direction;

(f) repeating steps (d) and (e) in combination with the further portion of each step becoming the previous portion of the next step, until the laterally extending crystalline region is formed.

42. The method of claim 41, wherein the irradiated portions are stripes.

43. The method of claim 42, wherein the stripes have a width between edges such that simultaneous lateral solidification from the edges does not result in complete crystallization of the stripes.

44. The method of claim 41, wherein the semiconductor material comprises silicon.

45. The method of claim 41, wherein the irradiated portions are chevrons.

46. The method of claim 41, wherein the substrate is a glass substrate.

47. The method of claim 41, wherein the substrate is a quartz substrate.

48. The method of claim 41, wherein the laterally extending crystalline region is defined by patterning the film of semiconductor material.

49. The method of claim 48, wherein the pattern of the film comprises a tail portion, a bottleneck portion which is contiguous to the tail portion, and a main-island portion which is contiguous to the bottleneck portion, and wherein the first portion of the film irradiated with the pulse radiation is in the tail portion of the film, and the further irradiated portions are in a stepping direction that first passes through the tail portion and then passes through the bottleneck portion and finally passes through the main-island portion.

50. The method of claim 41, wherein the irradiated portions are defined by a mask pattern.

51. The method of claim 50, wherein the mask pattern is projected.

52. The method of claim 50, wherein the mask pattern is defined by a proximity mask.

53. The method of claim 50, wherein the mask pattern is defined by a contact mask.

54. The method of claim 41, wherein the radiation comprises laser radiation.

55. The method of claim 41, wherein the laterally extending region is encapsulated.

56. On a supporting substrate, a semiconductor film processed by the method of claim 41.

57. On a supporting substrate, a plurality of semiconductor devices in a semiconductor film processed by the method of claim 41.

58. On a supporting substrate, an integrated circuit comprising a plurality of thin-film transistors in which at least the active-channel region is processed by the method of claim 41.

59. A liquid-crystal display device comprising a plurality of pixel-controller thin-film transistors in which at least the active-channel region is processed by the method of claim 41.

60. A liquid-crystal display device comprising a pixel-driver integrated circuit which comprises a plurality of thin-film transistors in which at least the active-channel region is processed by the method of claim 41.

61. An apparatus for making a laterally extending crystalline region in a film of semiconductor material on the substrate having at least a surface region consisting of a material which is different from the semiconductor material of the film and which is inert with respect to crystal growth in the film of semiconductor material, comprising:

(a) a pulsed laser for providing laser beam pulses;

(b) a beam mask through which the laser beam pulses pass for defining masked laser beam pulses each having a intensity pattern for irradiating the film of semiconductor material;

(c) a sample translation stage for holding the substrate having the film of semiconductor material while at least a portion of the film of semiconductor material is being irradiated by a masked laser beam pulse, and for translating the substrate having the film of semiconductor material in a lateral direction with respect to the masked beam pulses;

(d) a first optical path traversed by the laser beam pulses from the laser to the beam mask; and (e) a variable attenuator for attenuating the intensities of the masked laser beam pulses, wherein when the sample translation stage is in a first position, a first portion of the semiconductor film is irradiated by a masked radiation beam pulse so as to melt the semiconductor material in the first portion throughout its thickness, the molten semiconductor material in the first portion being permitted to laterally solidify so as to form at least one semiconductor crystal at the boundary of the first portion, which then becomes a previous portion for further processing, wherein the sample translation stage is moved in the lateral direction to a next position at which a next portion of the film of semiconductor material which overlaps the at least one semiconductor crystal in part is irradiated by another masked radiation beam pulse so a to melt the semiconductor material in the next portion throughout its thickness, the molten semiconductor material in the next portion being permitted to laterally solidify so as to enlarge the at least one semiconductor crystal by growth in the lateral direction, and wherein the sample translation stage is repeatedly moved in the lateral direction to a further position at which a further portion of the film of semiconductor material is irradiated by a further masked radiation beam pulse after the previous portion has been permitted to laterally solidify, each further portion overlapping the at least one semiconductor crystal of the previous portion in part so as to enlarge the at least one semiconductor crystal by growth in the lateral direction until a desired crystalline region is formed.

62. An apparatus for making a laterally extending crystalline region in the film of semiconductor material on the substrate having at least a surface region consisting of a material which is different from the semiconductor material of the film and which is inert with respect to crystal grow in the film of semiconductor material, comprising:

(a) a pulsed radiation beam source for providing radiation beam pulses;

(b) a beam mask through which the radiation beam pulses pass for defining masked radiation beam pulses each having an intensity pattern in the shape of at least one chevron for irradiating the film of semiconductor material; and (c) a sample translation stage for holding the substrate having the film of semiconductor material while at least a portion of the film of semiconductor material is being irradiated by a masked radiation beam pulse, and for translating the substrate having the film of semiconductor material in a lateral direction with respect to the masked radiation beam pulses, wherein when the sample translation stage is in a first position, a first portion of the film is irradiated by a masked radiation beam pulse so as to melt the semiconductor material in the first portion throughout its thickness, the molten semiconductor material in the first portion being permitted to laterally solidify so as to form at least one semiconductor crystal at the boundary of the first portion, which then becomes the previous portion for further processing, wherein the sample translation stage is moved in the lateral direction to a next position at which a next portion of the film of semiconductor material which overlaps the at least one semiconductor crystal in part is irradiated by another masked radiation beam pulse so as to melt the semiconductor material in the next portion throughout its thickness, the molten semiconductor material in the next portion being permitted to laterally solidify so as to enlarge the at least one semiconductor crystal by growth in the lateral direction, and wherein the sample translation stage is repeatedly moved in the lateral direction to a further position at which a further portion of the film of semiconductor material is irradiated by a further masked radiation beam pulse after the previous portion has been permitted to laterally solidify, each further portion overlapping the at least one semiconductor crystal of the previous portion in part so as to enlarge the at least one semiconductor crystal by growth in the lateral direction until the desires crystalline region is formed.

* * * * *

UNITED STATES PATENT AND TRADEMARK OFFICE
CERTIFICATE OF CORRECTION

PATENT NO. : 6,322,625 B2 Page 1 of 1
DATED : November 27, 2001
INVENTOR(S) : James S. Im It is certified that error appears in the above-identified patent and that said Letters Patent is hereby corrected as shown below:

<u>Title page,</u>
Item [63], "filed on Mar. 28, 1996" should read -- filed on May 28, 1996 --.

Signed and Sealed this

Twenty-seventh Day of August, 2002

Attest:

Attesting Officer

JAMES E. ROGAN
Director of the United States Patent and Trademark Office